(12) United States Patent
Iwata et al.

(10) Patent No.: US 10,025,184 B2
(45) Date of Patent: Jul. 17, 2018

(54) PHOTOCURABLE RESIN COMPOSITION AND PRODUCTION METHOD OF IMAGE DISPLAY DEVICE

(71) Applicant: DEXERIALS CORPORATION, Tokyo (JP)

(72) Inventors: Mizuki Iwata, Utsunomiya (JP); Takeshi Uematsu, Komatsu (JP); Kazuhito Kawabata, Utsunomiya (JP); Naoki Hayashi, Kanuma (JP)

(73) Assignee: DEXERIALS CORPORATION, Tokyo (JP)

( * ) Notice: Subject to any disclaimer, the term of this patent is extended or adjusted under 35 U.S.C. 154(b) by 421 days.

(21) Appl. No.: 14/892,115

(22) PCT Filed: May 21, 2014

(86) PCT No.: PCT/JP2014/063418
§ 371 (c)(1),
(2) Date: Nov. 18, 2015

(87) PCT Pub. No.: WO2014/196355
PCT Pub. Date: Dec. 11, 2014

(65) Prior Publication Data
US 2016/0091791 A1    Mar. 31, 2016

(30) Foreign Application Priority Data
Jun. 6, 2013 (JP) .................. 2013-120198

(51) Int. Cl.
*G03F 7/028* (2006.01)
*C08F 290/04* (2006.01)
(Continued)

(52) U.S. Cl.
CPC .......... *G03F 7/028* (2013.01); *C08F 290/048* (2013.01); *C08F 290/062* (2013.01);
(Continued)

(58) Field of Classification Search
CPC ...... G03F 7/028; G03F 7/0005; G03F 7/2002; C08F 290/048; C08F 290/062; C08F 290/067
See application file for complete search history.

(56) References Cited

U.S. PATENT DOCUMENTS

| 664,357 A | 12/1900 | Morrin |
| 6,664,357 B1 | 12/2003 | Edelman |

(Continued)

FOREIGN PATENT DOCUMENTS

| CN | 101652803 A | 2/2010 |
| JP | 2008-101105 A | 5/2008 |

(Continued)

OTHER PUBLICATIONS

Aug. 23, 2016 Office Action issued in Japanese Patent Application No. 2013-120198.

(Continued)

*Primary Examiner* — Daniel McNally
(74) *Attorney, Agent, or Firm* — Oliff PLC (57) ABSTRACT

A liquid photocurable resin composition contains a (meth)acrylate oligomer component, an alkyl (meth)acrylate monomer component, and a photopolymerization initiator component. The (meth)acrylate oligomer component contains at least one oligomer selected from the group consisting of a polyurethane (meth)acrylate oligomer, a polyisoprene (meth)acrylate oligomer, a polybutadiene (meth)acrylate oligomer, and a polyether (meth)acrylate oligomer that have a weight average molecular weight of 1,000 to 200,000. The photopolymerization initiator contains a molecule cleavage-type photoradical polymerization initiator and a hydrogen-abstracting photoradical polymerization initiator at a ratio by mass of 10:1 to 10:35. The cured resin that is obtained by photoradical polymerization of the photocurable resin composition has a glass transition temperature of (Continued)

−40 to 20° C. when the composition is cured at a curing ratio of the outermost surface of more than 90%.

5 Claims, 3 Drawing Sheets

(51) Int. Cl.
    *C08F 290/06*     (2006.01)
    *G03F 7/00*     (2006.01)
    *G03F 7/20*     (2006.01)

(52) U.S. Cl.
    CPC ........ *C08F 290/067* (2013.01); *G03F 7/0005* (2013.01); *G03F 7/2002* (2013.01)

(56) References Cited

U.S. PATENT DOCUMENTS

| | | | |
|---|---|---|---|
| 2007/0267133 A1* | 11/2007 | Matano | C09J 7/20 156/272.2 |
| 2012/0172477 A1 | 7/2012 | Huang et al. | |
| 2012/0177912 A1 | 7/2012 | Kim et al. | |

FOREIGN PATENT DOCUMENTS

| | | |
|---|---|---|
| JP | 2009084420 A | 4/2009 |
| JP | 2011-012099 A | 1/2011 |
| JP | 2012-144726 A | 8/2012 |
| JP | 2014-118450 A | 6/2014 |
| WO | 1999/002610 A1 | 1/1999 |
| WO | 2008/126860 A1 | 10/2008 |
| WO | 2010/027041 A1 | 3/2010 |
| WO | 2014/029062 A1 | 2/2014 |

OTHER PUBLICATIONS

Aug. 19, 2014 Search Report issued in International Patent Application No. PCT/JP2014/063418.

Nov. 18, 2016 Extended Search Report issued in European Patent Application No. 14807627.6.

Dec. 13, 2016 Search Report issued in European Patent Application No. 14807627.6.

Jul. 27, 2017 Office Action issued in Taiwanese Patent Application No. 103118379.

Feb. 4, 2017 Office Action issued in Chinese Patent Application No. 201480032145.8.

\* cited by examiner

PHOTOCURABLE RESIN COMPOSITION AND PRODUCTION METHOD OF IMAGE DISPLAY DEVICE

TECHNICAL FIELD

The present invention relates to a photocurable resin composition, and a method of producing an image display device including bonding and layering an image display member such as a liquid crystal display panel and a light-transmitting cover member such as a transparent protective sheet disposed on the surface side of the image display member through a light-transmitting cured resin layer.

BACKGROUND ART

An image display device such as a liquid crystal display panel used in a data terminal such as a smartphone has been produced by placing a photocurable resin composition between an image display member, such as a liquid crystal display panel and an organic EL panel, and a light-transmitting cover member, and then irradiating the composition with ultraviolet rays to cure the composition to form a light-transmitting cured resin layer, thereby bonding and layering the image display member and the light-transmitting cover member (Patent Literature 1).

A light-shielding layer is provided in a peripheral portion of a surface on the image display member side of the light-transmitting cover member to enhance the luminance and contrast of a display image, and the like. For this reason, curing of the photocurable resin composition interposed between such a light-shielding layer and the image display member does not sufficiently proceed. Therefore, a sufficient adhesion force cannot be obtained. Accordingly, there have been concerns that the light-transmitting cover member and the image display member are displaced, peeling between them and the photocurable resin adhesion faces occur, and the uncured and remaining photocurable resin composition is impregnated into the light-shielding layer to change the color.

It has been proposed that a thermal polymerization initiator is mixed in a photocurable resin composition to form a thermosetting and photocurable resin composition, the thermosetting and photocurable resin composition is applied to a surface of a light-transmitting cover member having a light-shielding layer, the applied surface is layered on an image display member, irradiated with ultraviolet rays and thus cured by light, and the entire product is heated to thermally cure the thermosetting and photocurable resin composition interposed between the light-shielding layer and the image display member (Patent Literature 2).

CITATION LIST

Patent Literature

Patent Literature 1: WO2010/027041
Patent Literature 2: WO2008/126860

SUMMARY OF INVENTION

Technical Problem

The technique in Patent Literature 2 is expected to solve the problems concerned in Patent Literature 1. However, a photopolymerization initiator is simultaneously used in combination with a thermal polymerization initiator, and a photopolymerization process and a thermal polymerization process need to be applied to the whole image display device. Therefore, there have been problems in which the investment of a facility for the polymerization process by ultraviolet rays and a facility for the thermal polymerization process are increased, and the storage stability of the thermosetting and photocurable resin composition is reduced. In order to prevent insufficient curing by oxygen during thermal curing, a surface of the thermosetting and photocurable resin composition needs to be cured by light prior to the thermal curing. However, the surface may not be irradiated with ultraviolet rays from the viewpoints of the structure of the display device, and in this case, thermal curing is difficult.

In order to solve these problems, a procedure in which a photocurable resin composition not containing a thermal polymerization initiator is applied to a surface of a light-transmitting cover member or an image display member, and is irradiated with ultraviolet rays and cured, and then the light-transmitting cover member and the image display member are bonded has been attempted. However, even by the attempt of the procedure, adhesion between the light-transmitting cover member and the image display member cannot be sufficiently achieved. In particular, a problem of peeling between both the members under a reliability test environment (under high temperature and high humidity) cannot be prevented from occurring. In addition, a problem, in which a cured product is likely to be stiffened by improvement of the composition to enhance adhesion and bonding cannot be performed, cannot be prevented from occurring.

An object of the present invention is to solve the problems in the conventional techniques. Also, another object thereof is to be able to produce an image display device by layering an image display member and a light-transmitting cover member disposed on the surface side through a light-transmitting cured resin layer formed from a photocurable resin composition, wherein the light-transmitting cured resin layer between a light-shielding layer and the image display member is in such a cured state that adhesion strength can be maintained without use of a thermal polymerization process even under a heating environment, and to provide a photocurable resin composition suitable to the production.

Solution to Problem

The present inventors have confirmed that when a liquid photocurable resin composition is irradiated with ultraviolet rays and a surface of the resultant cured product is observed, uncured liquid components are dotted. Accordingly, the present inventors have assumed that such an uncured liquid component exists on a bonding face of a light-transmitting cover member or an image display member. The present inventors have found as follows. When a molecule cleavage-type photoradical polymerization initiator and a hydrogen-abstracting photoradical polymerization initiator are used at a predetermined ratio as a photopolymerization initiator to be mixed in a liquid photocurable resin composition, not only the curing ratio of an entire light-transmitting cured resin layer that is obtained by curing the photocurable resin composition by light but also the curing ratio of the outermost surface thereof are more than 90%. When an image display member and a light-transmitting cover member are layered through such a cured resin layer, the adhesion of the photocurable resin composition between the light-transmitting cover member and the image display member through the cured resin layer is not reduced even under a heating environment. In addition, when the glass transition temperature of the light-transmitting cured resin layer is adjusted within a range of −40 to 20° C., there is no problem of peeling due to repulsion of the cured resin layer during bonding the image display member and the light-transmitting cover member through the cured resin layer. The present invention has thus been completed.

Specifically, the present invention provides a liquid photocurable resin composition containing the following components (A) to (C):

Component (A) a (meth)acrylate oligomer component;

Component (B) an alkyl (meth)acrylate monomer component; and

Component (C) a photopolymerization initiator component, wherein the (meth)acrylate oligomer component as the component (A) contains at least one oligomer selected from the group consisting of a polyurethane (meth)acrylate oligomer, a polyisoprene (meth)acrylate oligomer, a polybutadiene (meth)acrylate oligomer, and a polyether (meth)acrylate oligomer that have a weight average molecular weight of 1,000 to 200,000, the photopolymerization initiator as the component (C) contains a molecule cleavage-type photoradical polymerization initiator and a hydrogen-abstracting photoradical polymerization initiator at a ratio by mass of 10:1 to 10:35, and a cured resin that is obtained by photoradical polymerization by irradiation of the photocurable resin composition with ultraviolet rays in the air has a glass transition temperature of −40 to 20° C. when it is cured at a curing ratio of the outermost surface of more than 90%.

The photocurable resin composition of the present invention is particularly suitable for a liquid photocurable resin composition used to form a cured resin layer of an image display device in which an image display member and a light-transmitting cover member having a light-shielding layer formed in a peripheral portion thereof are layered through a light-transmitting cured resin layer formed from the liquid photocurable resin composition so that a light-shielding layer-forming face of the light-transmitting cover member is disposed on the image display member side.

The present invention provides a method of producing an image display device in which an image display member and a light-transmitting cover member having a light-shielding layer formed in a peripheral portion thereof are layered through a light-transmitting cured resin layer formed from a liquid photocurable resin composition so that a light-shielding layer-forming face of the light-transmitting cover member is disposed on the image display member side, the method including the following steps (a) to (c):

<Step (a)> applying the liquid photocurable resin composition of the present invention to a surface of the light-transmitting cover member on the light-shielding layer-forming side or a surface of the image display member at a thickness that is more than the thickness of the light-shielding layer so as to cancel a step formed between the light-shielding layer and the surface of the light-transmitting cover member on the light-shielding layer-forming side;

<Step (b)> irradiating the applied photocurable resin composition with ultraviolet rays to form a cured resin layer; and <Step (c)> bonding the light-transmitting cover member and the image display member so that the light-shielding layer and the cured resin layer are inside, to obtain an image display device.

Advantageous Effects of Invention

For the liquid photocurable resin composition of the present invention, a specific (meth)acrylate oligomer component having a weight average molecular weight within a specific range, any alkyl (meth)acrylate monomer component, and a mixed polymerization initiator including a molecule cleavage-type photoradical polymerization initiator and a hydrogen-abstracting photoradical polymerization initiator at a specific mixing ratio as photopolymerization initiator components are used as essential components. The liquid photocurable resin composition of the present invention is a photocurable resin composition in which a cured resin that is obtained by photoradical polymerization of the photocurable resin composition by irradiation with ultraviolet rays in the air has a glass transition temperature of −40 to 20° C. when it is cured at a curing ratio of the outermost surface of more than 90%. For this reason, the liquid photocurable resin composition can be preferably applied to the production of an image display device through only a photopolymerization process without use of a thermal polymerization process. The shape maintainability, adhesion, and adhesion maintainability of the cured resin layer can be improved when the composition is cured by light, followed by bonding.

BRIEF DESCRIPTION OF DRAWINGS

FIG. 1B is a view illustrating a step (B) in the method of producing an image display device of the present invention.

FIG. 1C is a view illustrating the step (B) in the method of producing an image display device of the present invention.

FIG. 1D is a view illustrating a step (C) in the method of producing an image display device of the present invention.

DESCRIPTION OF EMBODIMENTS

Hereinafter, a photocurable resin composition of the present invention will be described. After that, a method of producing an image display device using the photocurable resin composition will be described. In addition, an image display device to which the photocurable resin composition of the present invention is preferably applied and respective members constituting the image display device will be described in addition to the description of the method of producing an image display device of the present invention.
<Photocurable Resin Composition>

The photocurable resin composition of the present invention is particularly suitable for a liquid photocurable resin composition used to form a cured resin layer of an image display device in which an image display member and a light-transmitting cover member having a light-shielding layer formed in a peripheral portion thereof are layered through a light-transmitting cured resin layer formed from the liquid photocurable resin composition so that a light-shielding layer-forming face of the light-transmitting cover member is disposed on the image display member side. The photocurable resin composition is a liquid photocurable resin composition containing the following components (A) to (C):

Component (A) a (meth)acrylate oligomer component;
Component (B) an alkyl (meth)acrylate monomer component; and
Component (C) a photopolymerization initiator component. The photocurable resin composition of the present invention may further contain a plasticizer component as a component (D), if necessary.

In the present invention, the term "(meth)acrylate" includes acrylate and methacrylate.

The nature of the photocurable resin composition of the present invention is liquid. This is because a step formed between the light-shielding layer and a surface of the light-transmitting cover member on the light-shielding layer-forming side is canceled. The liquid used herein means one showing a viscosity of 0.01 to 100 Pa·s (cone-plate rheometer, 25° C., cone and plate: C35/2, rotation speed: 10 rpm).

The photocurable resin composition of the present invention is photoradically polymerized by irradiation with ultraviolet rays in the air to obtain a cured resin. The cured resin has a glass transition temperature (Tg) of −40 to 20° C., and preferably −20 to 0° C. when the composition is cured to have a curing ratio of the outermost surface, not only an average curing ratio of the entire cured resin, of more than 90%, and preferably more than 97%.

Attention is paid to the cured resin obtained by photoradical polymerization in the air in order to find a curing condition that does not affect properties of the cured resin by curing inhibition that occurs in the cured resin due to oxygen in the air. The curing ratio of the outermost surface of the cured resin is more than 90%. This is because a reduction in properties such as adhesion of the surface of the cured resin is practically negligible even when curing inhibition in the surface of the cured resin occurs. Tg of the cured resin at this curing ratio is adjusted to −40° C. to 20° C. This is because this range does not deteriorate properties such as bonding properties and adhesion maintainability of the cured resin in a film shape.

The curing ratio is a term referred to as gel fraction, and is a value defined as a ratio (ratio of consumption) of the present amount of (meth)acryloyl group after irradiation with ultraviolet rays to that of (meth)acryloyl group in the photocurable resin composition before the irradiation with ultraviolet rays. An increased value indicates progression of curing. Specifically, the curing ratio (gel fraction) can be calculated by substituting an absorption peak height (X) at 1,640 to 1,620 cm$^{-1}$ from a base line in a chart of FT-IR measurement of the photocurable resin composition layer before the irradiation with the irradiation with ultraviolet rays and a height (Y) of absorption peak (absorption peak derived from a carbon-carbon double bond of the (meth) acryloyl group) at 1,640 to 1,620 cm$^{-1}$ from a base line in a chart of FT-IR measurement of the photocurable resin composition layer after the irradiation with ultraviolet rays into the following formula (1).

$$\text{Curing ratio (\%)} = \{(X-Y)/X\} \times 100 \tag{1}$$

In the present invention, "curing ratio of a surface of a cured resin layer" means a curing ratio measured in a cured resin layer having a thickness of, preferably, 10 μm or less (for example, 5 μm). In contrast, "curing ratio of an entire cured resin layer" means a curing ratio measured in a cured resin layer having a thickness of 100 μm or more (for example, 200 μm).

<Component (A)>

The photocurable resin composition of the present invention contains a (meth)acrylate oligomer component as the component (A) that is a photoradical polymerization component to impart properties of forming a film from a cured product. The (meth)acrylate oligomer component contains at least one oligomer selected from the group consisting of a polyurethane (meth)acrylate oligomer, a polyisoprene (meth)acrylate oligomer, a polybutadiene (meth)acrylate oligomer, and a polyether (meth)acrylate oligomer. The oligomers preferably have a weight average molecular weight of 1,000 to 200,000, and more preferably 30,000 to 100,000. An oligomer having a weight average molecular weight within this range satisfies the shape maintainability of the cured resin layer, and achieves an effect of partly serving as an element of adhesion expression.

The polyurethane (meth)acrylate oligomer is a polyurethane-based (meth)acrylate oligomer having a polyurethane skeleton as a main chain, and specific preferred examples thereof may include an aliphatic urethan acrylate (CN9014 (molecular weight: 25,000), Sartomer Japan Inc.; and UA-1, Light Chemical Industries Co., Ltd.).

The polyisoprene (meth)acrylate oligomer is a polyisoprene-based (meth)acrylate oligomer having a polyisoprene skeleton as a main chain, and specific preferred examples thereof may include esterified compounds of maleic anhydride adduct of polyisoprene polymer and 2-hydroxyethyl methacrylate (UC102 (molecular weight in terms of polystyrene: 17,000), Kuraray Co., Ltd.; and UC203 (molecular weight in terms of polystyrene: 35,000), Kuraray Co., Ltd.).

The polybutadiene (meth)acrylate oligomer is a polybutadiene-based (meth)acrylate oligomer having a polybutadiene skeleton or a hydrogenated polybutadiene skeleton as a main chain, and specific preferred examples thereof may include esterified compounds of polybutadiene polymer and 2-hydroxyethyl methacrylate (EMA-3000 (molecular weight: 3,700), Nippon Soda Co., Ltd.).

The polyether (meth)acrylate oligomer is a polyether-based (meth)acrylate oligomer having a polyether skeleton such as polyethylene glycol and polypropylene glycol as a main chain, and specific preferred examples thereof may include terminal acrylic modified polyethers (UN-6202 (molecular weight: 6,500), Negami Chemical Industrial Co., Ltd., and EBECRYL230 (molecular weight: 5,000), DAICEL-CYTEC Company, Ltd.).

The mixed amount of the (meth)acrylate oligomer component as the component (A) in the photocurable resin composition is preferably 30 to 80% by mass, and more preferably 40 to 55% by mass in order to improve film-forming properties of a cured product, suppress slipping after adhesion, and maintain such a hardness that facilitates bonding members.

<Component (B)>

The photocurable resin composition of the present invention contains any alkyl (meth)acrylate monomer component as the component (B) to adjust Tg and elastic modulus of the light-transmitting cured resin. The alkyl group may be bonded to a hydroxyl group, an aryl group such as a phenyl group, a heterocycloalkyl group, or the like. The number of carbon atoms in the alkyl group is preferably 4 to 18, and more preferably 8 to 12. Examples of particularly preferred component (B) may include lauryl (meth)acrylate, octyl (meth)acrylate, and decyl (meth)acrylate.

The mixed amount of the alkyl (meth)acrylate monomer component as the component (B) in the photocurable resin composition is preferably 5 to 45% by mass, and more preferably 20 to 35% by mass so as not to make Tg and elastic modulus of the cured product too high, and to maintain the surface adhesive properties.

In addition to the alkyl (meth)acrylate monomer as the component (B), a photoradically polymerizable acrylic monomer component that functions as a reactive diluent may be mixed, if necessary. Specific examples thereof may include isobornyl (meth)acrylate, dicyclopentenyloxyethyl (meth)acrylate, benzyl (meth)acrylate, and tetrahydrofurfuryl (meth)acrylate.

<Component (C)>

The photocurable resin composition of the present invention contains a photopolymerization initiator component as the component (C) to photoradically polymerize photopolymerizable components including the (meth)acrylate oligomer component as the component (A) and the alkyl (meth)acrylate monomer component as the component (B).

In the present invention, the photopolymerization initiator as the component (C) contains a molecule cleavage-type photoradical polymerization initiator having a property of a main absorption region on a shorter wavelength side and a structural property of α-hydroxy ketone skeleton, and a hydrogen-abstracting photoradical polymerization initiator having properties of reducing inhibition due to oxygen and imparting excellent surface hardenability, and a structural property of benzophenone skeleton. The mixed ratio by mass of the molecule cleavage-type photoradical polymerization initiator to the hydrogen-abstracting photoradical polymerization initiator is preferably 10:1 to 10:35, and more preferably 10:15 to 10:30 in order to improve the outermost-surface hardenability and adhesion strength maintainability of the cured resin after curing by light.

The mixed amount of the photopolymerization initiator as the component (C) in the photocurable resin composition is preferably 0.5 to 8 parts by mass, and more preferably 1.5 to 4.5 parts by mass, relative to 100 parts by mass of the total amount of the (meth)acrylate oligomer component as the component (A) and the alkyl (meth)acrylate component as the component (B), in order to prevent a reduction in the surface hardenability when curing the photocurable resin composition, prevent peeling after bonding, and suppress a problem caused by coloring.

As the molecule cleavage-type photoradical polymerization initiator, a known molecule cleavage-type photoradical polymerization initiator can be used. Examples thereof may include 1-hydroxy-cyclohexyl phenyl ketone (IRGACURE 184, BASF Japan Ltd.) and 2-hydroxy-1-{4-[4-(2-hydroxy-2-methyl-propylonyl)benzyl]phenyl}-2-methyl-1-propan-1-one (IRGACURE 127, BASF Japan Ltd.). As the hydrogen-abstracting photoradical polymerization initiator, a known hydrogen-abstracting photoradical polymerization initiator can be used. Examples thereof may include benzophenone, and 2,4-diethylthioxanthone (KAYACURE DETX-S, NIPPON KAYAKU Co., Ltd.).

<Component (D)>

In order to reduce the curing shrinkage ratio of the curable resin composition, the photocurable resin composition of the present invention may contain a plasticizer component as the component (D), if necessary. As the plasticizer component, a known plasticizer or tackifier that does not have a (meth) acryloyl group in the molecule and is not photoradically polymerized by irradiation with ultraviolet rays can be used. For example, terpene-based resins such as a terpene resin, a terpene-phenolic resin, and a hydrogenated terpene resin, rosin resins such as natural rosin, polymerized rosin, rosin esters, and hydrogenated rosins, petroleum resins such as polybutadiene and polyisoprene, or the like, can be used.

The mixed amount of the plasticizer component as the component (D) in the photocurable resin composition is preferably 35% by mass or less, and more preferably 25% by mass or less in order to suppress delay of curing reaction during irradiation with ultraviolet rays and curing inhibition due to oxygen, suppress occurrence of bleeding of the plasticizer component on the outermost surface of the light-transmitting cured resin, and suppress occurrence of peeling during bonding and peeling under a heat environment.

<Other Components>

In addition to the components (A) to (C), various additives can be mixed in the photocurable resin composition of the present invention within a range not impairing the effects of the present invention. For example, a chain-transfer agent for adjustment of weight average molecular weight of the cured resin can be mixed. Examples thereof may include 2-mercaptoethanol, lauryl mercaptan, glycidyl mercaptan, mercaptoacetic acid, 2-ethylhexyl thioglycolate, 2,3-dimethylcapto-1-propanol, and α-methylstyrene dimer. Further, general additives including an adhesion improving agent such as a silane coupling agent and an antioxidant can be mixed, if necessary.

The photocurable resin composition of the present invention can be prepared by uniformly mixing the above-described components (A) to (C) and the component (D) and other additives to be added if necessary, through a known mixing procedure.

<Method of Producing Image Display Device>

Hereinafter, each step of a method of producing an image display device of the present invention including steps (a) to (d) will be described in detail with reference to the drawings. In the following production method, the photocurable resin composition of the present invention is used as a liquid photocurable resin composition.

<Step (a) (Applying Step)>

Figure 1A:
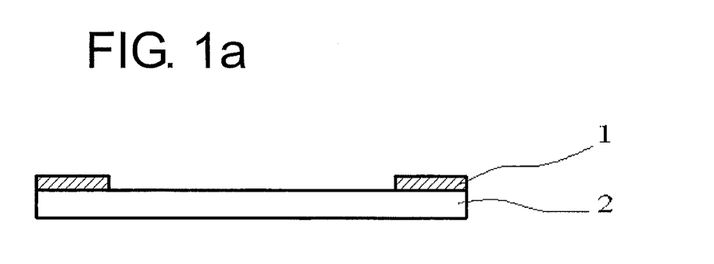
FIG. 1a is a view illustrating a step (a) in a method of producing an image display device of the present invention.
Figure 1B:
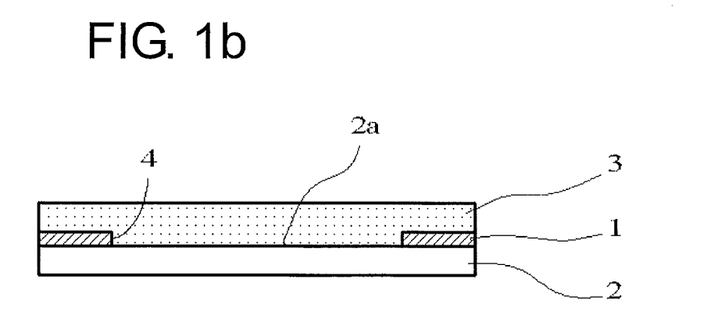
FIG. 1b is a view illustrating the step (a) in the method of producing an image display device of the present invention.

As shown in FIG. 1a, a light-transmitting cover member 2 having a light-shielding layer 1 formed in a peripheral portion of one side is prepared. As shown in FIG. 1b, a liquid photocurable resin composition 3 is applied to a surface 2a of the light-transmitting cover member 2 at a thickness that is more than the thickness of the light-shielding layer 1 so as to cancel a step 4 formed between the light-shielding layer 1 and the surface 2a of the light-transmitting cover member 2 on the light-shielding layer-forming side. Specifically, the photocurable resin composition 3 is evenly applied to the entire surface including the surface of the light-shielding layer 1 and the surface 2a of the light-transmitting cover member 2 on the light-shielding layer-forming side so as not to form a step. Therefore, the photocurable resin composition 3 is applied so that the thickness thereof is preferably 1.2 to 50 times, and more preferably 2 to 30 times the thickness of the light-shielding layer 1.

The application of the photocurable resin composition 3 may be performed a plurality of times until a necessary thickness is achieved.

The light-transmitting cover member 2 is required to be light transmissive so that an image formed in the image display member can be visually recognized, and examples thereof may include a plate-shaped material and a sheet-shaped material that are made of glass, an acrylic resin, polyethylene terephthalate, polyethylene naphthalate, polycarbonate, and the like. These materials may be subjected to a single-side or double-side hard coating treatment, an antireflection treatment, or the like. The physical properties such as thickness and elasticity of the light-transmitting cover member 2 can be appropriately determined depending on the purposes of use.

The light-shielding layer 1 is provided to increase the contrast of an image. Further, the light-shielding layer 1 is obtained by applying a paint colored black or the like through a screen printing method or the like, followed by drying and curing. The thickness of the light-shielding layer 1 is generally 5 to 100 µm. This thickness corresponds to the step 4.

The nature of the photocurable resin composition 3 used in this step is liquid. By use of the liquid photocurable resin composition, the step 4 formed between the light-shielding layer 1 and the surface 2a of the light-transmitting cover member 2 on the light-shielding layer forming side can be canceled.

<Step (b) (Curing Step)>

Figure 1C:
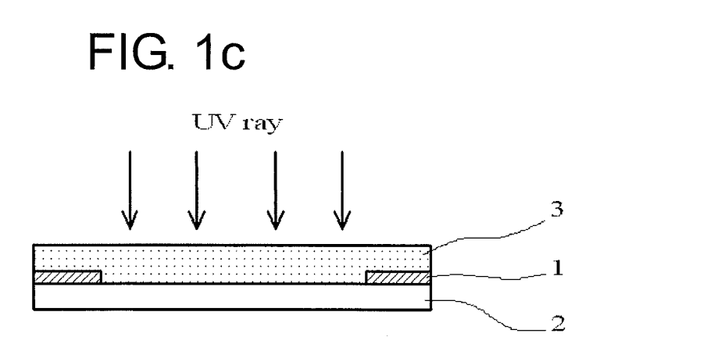
FIG. 1c is a view illustrating a step (b) in the method of producing an image display device of the present invention.
Figure 1D:
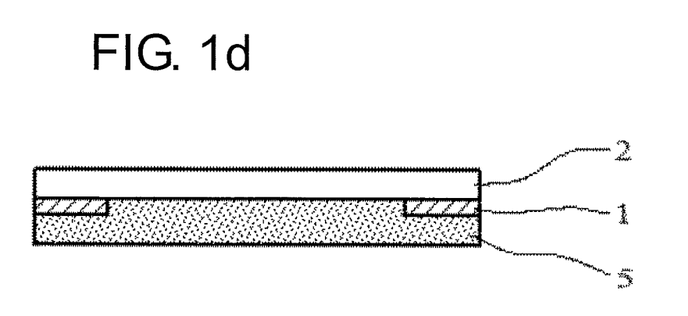
FIG. 1d is a view illustrating the step (b) in the method of producing an image display device of the present invention.

As shown in FIG. 1c, the photocurable resin composition 3 applied in the step (a) is irradiated with ultraviolet rays to form a cured resin layer 5 (FIG. 1d). In this case, it is preferable that the light-transmitting cured resin layer 5 having a glass transition temperature of −40 to 20° C. be formed by curing so that the curing ratio of the entire layer is more than 90%, and preferably 95% or more, and the curing ratio of the outermost surface is more than 90%, and preferably 97% or more. By curing the composition in this manner, the light-transmitting cured resin layer between the light-shielding layer 1 and the image display member can be sufficiently cured by light without removal from therebetween, and the curing shrinkage can be reduced.

In the irradiation with ultraviolet rays, irradiation conditions such as the kind, output, and cumulative light amount of a light source can be appropriately selected so as to cure the composition so that the curing ratio (gel fraction) of the outermost surface of the cured resin layer 5 is preferably more than 90%. For example, a photoradically polymerization process condition of (meth)acrylate by a known irradiation with ultraviolet rays can be adopted.

<Step (c) (Bonding Step)>

Figure 1E:
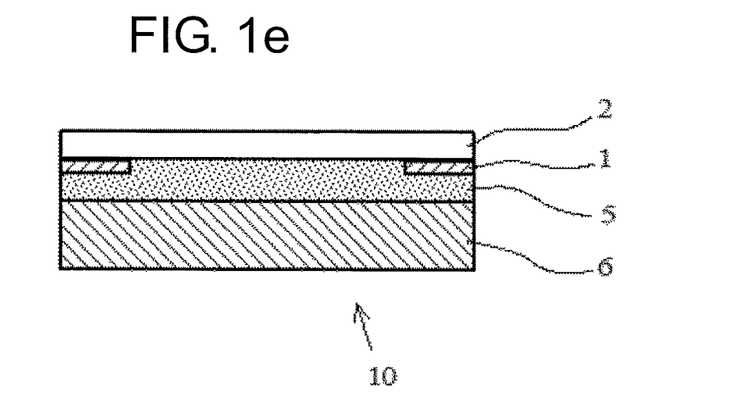
FIG. 1e is a view illustrating a step (c) in the method of producing an image display device of the present invention.

As shown in FIG. 1e, the light-transmitting cover member 2 is bonded to an image display member 6 from the light-transmitting cured resin layer 5 side. Thus, an image display device 10 is obtained. Bonding can be performed by pressurization at 10° C. to 80° C. using a known compression bonding device.

Examples of the image display member 6 may include a liquid crystal display panel, an organic EL display panel, a plasma display panel, and a touch panel. The touch panel used herein means an image display and input panel in which a display element such as a liquid crystal display panel and a position input device such as a touch pad are assembled.

The level of light transmission property of the light-transmitting cured resin layer 5 requires such a light transmission property that an image formed in the image display member 6 can be visually recognized.

Next, an example of applying a photocurable resin composition to a surface of an image display member to form a cured resin layer will be described with reference to FIGS. 1A to 1D. In FIGS. 1A to 1D and FIGS. 1a to 1e, the same reference numerals denote the same components.

<Step (A) (Applying Step)>

As shown in FIG. 1A, a photocurable resin composition 3 is evenly applied to a surface of an image display member 6. In this case, the application thickness is preferably 1.2 to 50 times, and more preferably 2 to 30 times the thickness of the light-shielding layer so that a step formed between the light-shielding layer and the surface of the light-transmitting cover member on the light-shielding layer-forming side is canceled.

The application of the photocurable resin composition 3 may be performed a plurality of times until a necessary thickness is achieved.

<Step (B) (Curing Step)>

As shown in FIG. 1B, the photocurable resin composition 3 applied in the step (A) is irradiated with ultraviolet rays to form a cured resin layer 5 (FIG. 1C). In this case, it is preferable that the light-transmitting cured resin layer 5 having a glass transition temperature of −40 to 20° C. be formed by curing so that the curing ratio of the entire layer is more than 90%, and preferably 95% or more, and the curing ratio of the outermost surface is more than 90%, and preferably 97% or more. By curing the composition in this manner, the light-transmitting cured resin layer between the light-shielding layer 1 and the image display member can be sufficiently cured by light without removal, and the curing shrinkage can be reduced.

<Step (C) (Bonding Step)>

As shown in FIG. 1D, the light-transmitting cover member 2 is bonded to the cured resin layer 5 of the image display member 6 from the light-shielding layer 1 side. Bonding can be performed by pressurization at 10 to 80° C. using a known compression bonding device.

Examples of the image display member 6 may include a liquid crystal display panel, an organic EL display panel, a plasma display panel, and a touch panel.

The level of light transmission property of the light-transmitting cured resin layer 5 requires such a light transmission property that an image formed in the image display member 6 can be visually recognized.

EXAMPLES

Hereinafter, the present invention will be described specifically by means of Examples.

Examples 1 to 6 and Comparative Examples 1 to 4

A (meth)acrylate oligomer component, an alkyl (meth)acrylate monomer component, a plasticizer component (solid tackifier and liquid plasticizer component), and a photopolymerization initiator component were uniformly mixed in mixed amounts (part by mass) shown in Table 1 to prepare a photocurable resin composition.

The photocurable resin composition was then discharged onto the entire surface of a glass plate by a slit-type resin dispenser, to form a photocurable resin composition film with an average thickness of 200 µm.

Subsequently, the photocurable resin composition film was irradiated with ultraviolet rays having a strength of 200 mW/cm$^2$ with the irradiation time being changed by an ultraviolet ray irradiation device (UVL-7000M4-N, manufactured by USHIO INC.) so that the integrated light amount was 1,000 mJ/cm$^2$, 2,500 mJ/cm$^2$, 5,000 mJ/cm$^2$, or 7,500 mJ/cm$^2$. Thus, the photocurable resin composition film was cured to form a light-transmitting cured resin layer. The curing ratio corresponding to each integrated light amount was determined using the height of absorption peak (absorption peak derived from a carbon-carbon double bond of a (meth)acryloyl group) at 1,640 to 1,620 cm$^{-1}$ in a chart of FT-IR measurement as an indication. Table 2 shows the obtained results. The curing ratio obtained herein represents the curing ratio of the whole light-transmitting cured resin layer. The curing ratio of a surface of the cured resin layer was determined as follows. The photocurable resin composition was applied to a glass substrate so that the thickness thereof was 5 μm, to form a photocurable resin composition film, and the formed photocurable resin composition film was cured under the same ultraviolet ray irradiation condition. The curing ratio of the obtained light-transmitting cured resin thin film was determined as the curing ratio of the surface of the cured resin layer by the same FT-IR measurement. Table 2 shows the obtained results.

Next, the glass plate obtained as described above was placed on a face on which a polarizing plate of a liquid crystal display element with a size of 40 (W)×70 (L) mm was layered so that the cured resin layer side was the polarizing plate side. The glass plate was bonded by pressurization from the glass plate side with a rubber roller.

"Bonding properties" and "adhesion maintainability" of the light-transmitting cured resin layer in each of Examples and Comparative Examples were evaluated as described below. Table 2 shows the obtained results.

(Bonding Properties)

For a sample obtained in the step (c), the shape maintainability of the resin layer cured by irradiation with ultraviolet rays was evaluated as follows. The presence or absence of the resin layer crushed by insufficient curing, and the occurrence of air bubbles and peeling between the resin layer and the polarizing plate by repulsion of the cured resin were visually observed. A case where a defect does not occur is evaluated as good "A." A case where a defect occurs is evaluated as poor "C."

(Adhesion Maintainability)

A part of an image display member 6 in a liquid crystal display device in which the result of bonding properties was evaluated good "A" was held, vertically fixed, and allowed to stand at 85° C. for 24 hours. After that, the displacement of the glass plate and the occurrence of peeling were visually observed. A case where a defect does not occur is evaluated as good "A." A case where a defect occurs is evaluated as poor "C."

As an indication of bonding properties of completely cured product, the elastic modulus and the glass transition temperature were measured by a dynamic viscoelasticity measuring device (DMA, compression mode, 1 Hz, temperature variable). Table 2 shows the obtained results. In practice, it is desirable that the elastic modulus be 1.0E+05 or more. It is necessary that the glass transition temperature range be −40 to 20° C. when the surface curing ratio of the cured resin layer is more than 90%. The glass transition temperature of the cured resin layer is the glass transition temperature of a cured resin layer obtained by irradiation with ultraviolet rays at a UV irradiation dose of 5,000 mJ/cm$^2$ in principle. In Example 6 and Comparative Example 4, however, the glass transition temperature is the glass transition temperature of a cured resin layer obtained by irradiation with ultraviolet rays at a UV irradiation dose of 7,500 mJ/cm$^2$.

TABLE 1

| Component Name | Product Name | Example (Part By Mass) | | | | | | Comparative Example (Part By Mass) | | | |
| --- | --- | --- | --- | --- | --- | --- | --- | --- | --- | --- | --- |
| | | 1 | 2 | 3 | 4 | 5 | 6 | 1 | 2 | 3 | 4 |
| (Meth)Acrylate Oligomer Component | Acrylated Polyacrylate (*1) | 58.5 | 36 | | | | | 59.5 | 40 | | |
| | Polyether Urethane Acrylate (*2) | | | 34.5 | | | | | | | |
| | Hydrogenated Butadiene Urethane Acrylate (*3) | | | | 44 | 55.5 | | | | 55.5 | |
| | Methacrylated Polyisoprene (*4) | | | | | | 30 | | | | 30 |
| Alkyl (Meth)Acrylate Monomer Component | Monofunctional Aliphatic (Meth)Acrylate (*5) | 5 | 14 | 31 | 24 | 18 | 26.5 | 5 | 6 | 18 | 26.5 |
| | Monofunctional Hydroxyl Group-Containing (Meth)Acrylate (*6) | 5 | 14 | 12 | 5 | 6 | 4 | 5 | 12 | 6 | 4 |
| | Monofunctional Aromatic (Meth)Acrylate (*7) | | 5 | | | | | | 5 | | |
| Plasticizer Component | Aliphatic Saturated Hydrocarbon Resin (*8) | | 10 | | | | | 35 | | | |
| | Hydrogenated Terpene Resin (*9) | | | | 24 | 18.5 | 6 | | | 18 | |
| | Low Molecular Esters (*10) | 10 | 18 | 10 | | | | 10 | | | |
| | Liquid Acrylic Polymer (*11) | 20 | | 10 | | | | 20 | | | |
| | Liquid Butadiene Polymer (*12) | | | | | | 29 | | | | 35 |
| Molecule Cleavage-Type Photoradical Polymerization Initiator | Irgacure 184 (*13) | 0.5 | 2 | 1.5 | 2 | 0.5 | 2.5 | 0.5 | 2 | 0.5 | 2.5 |
| Hydrogen-Abstracting Photoradical Polymerization Initiator | Benzophenon (*14) | 1 | 1 | 1 | 1 | 1.5 | 2 | | 1 | 2 | 2 |

Notes for Table 1:
(*1) Acrylated 2-ethyl hexyl acrylate oligomer (CN821, ARKEMA K.K.; Mw = 150,000 to 200,000)
(*2) Polypropylene glycol terminal acrylic modified oligomer (EBECRYL230, DANCEL-CYTEC Company, Ltd.; Mw = 50,000 to 100,000)
(*3) Hydrogenated polybutadiene acrylic modified oligomer (CN9014, ARKEMA K.K.; Mw = 25,000 to 30,000)
(*4) Polyisoprene acrylic modified oligomer (UC-203, Kuraray Co., Ltd.; Mw = 25,000 to 30,000)
(*5) Isostearyl acrylate (Osaka Organic Chemical Industry Ltd.)
(*6) 4-Hydroxybutyl acrylate (Osaka Organic Chemical Industry Ltd.)
(*7) Nonylphenol EO-modified acrylate (Toagosei Co., Ltd.)
(*8) KR1842 (Arakawa Chemical Industries, Ltd.)
(*9) Clearon M105 (Yasuhara Chemical Co., Ltd.)
(*10) Hexamoll DINCH (BASF Japan Ltd.)
(*11) ARUFON1170 (Toagosei Co., Ltd.)
(*12) PolyOil-110 (Evonik Japan Co., Ltd.)
(*13) 1-Hydroxy-cyclohexyl phenyl ketone (BASF Japan Ltd.)
(*14) Benzophenone (Wako Pure Chemical Industries, Ltd.)

TABLE 2

| Evaluation Item | UV Irradiation Dose mJ/cm² | Example 1 | Example 2 | Example 3 | Example 4 | Example 5 | Example 6 | Comparative Example 1 | Comparative Example 2 | Comparative Example 3 | Comparative Example 4 |
|---|---|---|---|---|---|---|---|---|---|---|---|
| Curing Ratio (%) | 1000 | 92 | 84 | 81 | 74 | 82 | 64 | 86 | 90 | 78 | 60 |
| | 2500 | 98 | 95 | 92 | 89 | 91 | 78 | 93 | 94 | 86 | 73 |
| | 5000 | >99 | >99 | 98 | 95 | 94 | 87 | 97 | 98 | 95 | 82 |
| | 7500 | >99 | >99 | >99 | >99 | 98 | 92 | >99 | >99 | 98 | 91 |
| Surface Curing Ratio (%) | 1000 | 92 | 80 | 77 | 74 | 82 | 60 | 79 | 82 | 69 | 60 |
| | 2500 | 98 | 92 | 89 | 89 | 91 | 69 | 85 | 88 | 77 | 68 |
| | 5000 | >99 | 95 | 94 | 95 | 94 | 82 | 87 | 92 | 85 | 79 |
| | 7500 | >99 | >99 | >99 | >99 | 98 | 94 | 87 | 96 | 90 | 91 |
| Bonding Properties (Repulsion/ Crushing) | 1000 | A | A | A | C | A | C | A | C | C | C |
| | 2500 | A | A | A | A | A | C | A | C | C | C |
| | 5000 | A | A | A | A | A | A | A | C | C | A |
| | 7500 | A | A | A | A | A | A | A | C | C | A |
| Adhesion Maintainability (Slipping/ Peeling) | 1000 | A | C | C | C | C | C | C | C | C | C |
| | 2500 | A | A | A | A | A | C | C | C | C | C |
| | 5000 | C | A | A | A | A | C | C | C | C | C |
| | 7500 | — | A | A | A | C | A | — | — | C | C |
| Elastic Modulus | E' [Pa] @5000 mJ/cm² | 8.9E+05 | 4.6E+05 | 3.3E+05 | 7.2E+05 | 8.7E+05 | 3.5E+05 | 8.7E+05 | 3.8E+05 | 1.3E+05 | 2.2E+05 |
| Glass Transition Temperature | Tg [° C.] @5000 mJ/cm² | −13 | 0 | −21 | −2 | −5 | −38 | −13 | 21 | −7 | −46 |

As seen from Tables 1 and 2, when the photocurable resin composition of Example 1 was cured by irradiation with ultraviolet rays at 1,000 to 2,500 mJ/cm², both the bonding properties and the adhesion maintainability were evaluated as good. When the photocurable resin compositions of Examples 2 to 4 were cured by irradiation with ultraviolet rays at 2,500 to 7,500 mJ/cm², both the bonding properties and the adhesion maintainability were evaluated as good. When the photocurable resin composition of Example 5 was cured by irradiation with ultraviolet rays at 2,500 to 5,000 mJ/cm², both the bonding properties and the adhesion maintainability were evaluated as good. When the photocurable resin composition of Example 6 was cured by irradiation with ultraviolet rays at 7,500 mJ/cm², both the bonding properties and the adhesion maintainability were evaluated as good.

In contrast, in all the photocurable resin compositions in Comparative Example 1 (example using only a molecule cleavage-type photoradical polymerization initiator as a photopolymerization initiator), Comparative Example 2 (example in which the glass transition temperature was higher than 20° C. when the surface curing ratio was more than 90%), Comparative Example 3 (example in which the mixing ratio of a hydrogen-abstracting photoradical polymerization initiator to a molecule cleavage-type photoradical polymerization initiator was excess), and Comparative Example 4 (example in which the glass transition temperature was lower than −40° C. when the surface curing ratio was more than 90%), the adhesion maintainability was evaluated as poor. In the photocurable resin compositions in Comparative Examples 2 and 3, not only the adhesion maintainability but also the bonding properties were evaluated as poor.

INDUSTRIAL APPLICABILITY

A photocurable resin composition of the present invention contains a (meth)acrylate oligomer component, an alkyl (meth)acrylate monomer component, and a photopolymerization initiator component that are selected as three specific components, and if necessary, a plasticizer. In the photocurable resin composition, the ratio by mass of a molecule cleavage-type photoradical polymerization initiator and a hydrogen-abstracting photoradical polymerization initiator is adjusted to a specific range. The glass transition temperature of a light-transmitting cured resin layer is −40 to 20° C. when the surface curing ratio is more than 90%. Therefore, the shape maintainability, adhesion, and adhesion maintainability of the cured resin layer can be improved when the composition is cured by light, followed by bonding. For this reason, the photocurable resin composition is applied to the production of an image display device through a photopolymerization process without use of a thermal polymerization process.

REFERENCE SIGNS LIST

1 light-shielding layer
2 light-transmitting cover member
2a surface of light-transmitting cover member on light-shielding layer-forming side
3, 3a, 3b photocurable resin composition
4 step
5 cured resin layer
6 image display member
10 image display device

The invention claimed is:

1. A liquid photocurable resin composition comprising the following components (A) to (C):
    Component (A) a (meth)acrylate oligomer component;
    Component (B) an alkyl (meth)acrylate monomer component; and
    Component (C) a photopolymerization initiator component, wherein
    the (meth)acrylate oligomer component as the component (A) contains at least one oligomer selected from the group consisting of a polyurethane (meth)acrylate oligomer, a polyisoprene (meth)acrylate oligomer, a polybutadiene (meth)acrylate oligomer, and a polyether (meth)acrylate oligomer that have a weight average molecular weight of 1,000 to 200,000, the photopolymerization initiator as the component (C) contains a molecule cleavage-type photoradical polymerization initiator and a hydrogen-abstracting photoradical polymerization initiator at a ratio by mass of 10:1 to 10:35, and a cured resin that is obtained by photoradical polymerization by irradiation of the photocurable resin composition with ultraviolet rays in the air has a glass transition temperature of −40 to 20° C. when it is cured at a curing ratio of the outermost surface of more than 90%.

2. The photocurable resin composition according to claim 1, further comprising the following component (D):

Component (D) a plasticizer component.

3. The photocurable resin composition according to claim 2, being a liquid photocurable resin composition used to form a cured resin layer of an image display device in which an image display member and a light-transmitting cover member having a light-shielding layer formed in a peripheral portion thereof are layered through a light-transmitting cured resin layer formed from the liquid photocurable resin composition so that a light-shielding layer-forming face of the light-transmitting cover member is disposed on the image display member side.

4. The photocurable resin composition according to claim 1, being a liquid photocurable resin composition used to form a cured resin layer of an image display device in which an image display member and a light-transmitting cover member having a light-shielding layer formed in a peripheral portion thereof are layered through a light-transmitting cured resin layer formed from the liquid photocurable resin composition so that a light-shielding layer-forming face of the light-transmitting cover member is disposed on the image display member side.

5. A method of producing an image display device in which an image display member and a light-transmitting cover member having a light-shielding layer formed in a peripheral portion thereof are layered through a light-transmitting cured resin layer formed from a liquid photocurable resin composition so that a light-shielding layer-forming face of the light-transmitting cover member is disposed on the image display member side, the method comprising the following steps (a) to (c):

<Step (a)>
applying the liquid photocurable resin composition according to claim 1 to a surface of the light-transmitting cover member on the light-shielding layer-forming side or a surface of the image display member at a thickness that is more than a thickness of the light-shielding layer so as to cancel a step formed between the light-shielding layer and the surface of the light-transmitting cover member on the light-shielding layer-forming side;

<Step (b)>
irradiating the applied photocurable resin composition with ultraviolet rays to form a cured resin layer; and <Step (c)>
bonding the light-transmitting cover member and the image display member so that the light-shielding layer and the cured resin layer are inside, to obtain an image display device.

* * * * *